United States Patent [19]
Ohori

[11] Patent Number: 5,844,260
[45] Date of Patent: Dec. 1, 1998

[54] COMPOUND SEMICONDUCTOR DEVICE CONSTRUCTED ON A HETEROEPITAXIAL SUBSTRATE

[75] Inventor: Tatsuya Ohori, Kawasaki, Japan

[73] Assignee: Fujitsu Limited, Kanagawa, Japan

[21] Appl. No.: 937,785

[22] Filed: Sep. 24, 1997

Related U.S. Application Data

[63] Continuation of Ser. No. 133,242, Oct. 8, 1993, abandoned.

[30] Foreign Application Priority Data

Oct. 9, 1992 [JP] Japan ................................. 4-296587
Feb. 8, 1993 [JP] Japan ................................. 5-041797

[51] Int. Cl.⁶ ................. H01L 31/0328; H01L 31/0336; H01L 31/072
[52] U.S. Cl. ....................... 257/190; 257/192; 257/200; 257/201
[58] Field of Search ...................... 257/190, 192, 257/194, 200, 201

[56] References Cited

U.S. PATENT DOCUMENTS 4,994,867  2/1991  Biegelsen ................. 257/190
5,053,835  10/1991  Horikawa et al. .......... 257/190

FOREIGN PATENT DOCUMENTS 63-186416  8/1988  Japan ..................................... 257/194

OTHER PUBLICATIONS

J. Appl. Phys., Jun. 1989, Chang et al., 66:2993–2996, *Characteristics of dislocations at strained hetroepitaxial InGaAs/GaAs Interfaces.*
Journal of Crystal Growth, Jul. 1974, Matthews and Blakeslee, 27:118–125 *Defects In Epitaxial Multilayers.*

*Primary Examiner*—Steven H. Loke
*Attorney, Agent, or Firm*—Armstrong, Westerman, Hattori, McLeland & Naughton

[57] ABSTRACT

A compound semiconductor device constructed on a heteroepitaxial substrate includes a silicon substrate, a first compound semiconductor layer of a first compound semiconductor material provided on the silicon substrate as a buffer layer, a second compound semiconductor layer of a second compound semiconductor material having a lattice constant larger than that of the first compound semiconductor layer, and an active device provided on the second compound semiconductor layer, wherein the second compound semiconductor layer has a thickness exceeding a critical thickness above which dislocations develop due to the misfit in the lattice constant between the first and second compound semiconductor layers.

10 Claims, 8 Drawing Sheets

FIG. 10(A)

| | |
|---|---|
| Si-InAlGaAs | 65 |
| InGaAs  2 DEG | 64 |
| SLSi (InAlGaAs / AlGaAs) | 63 |
| GaAs | 62 |
| Si | 61 |

FIG. 10(B)

| | |
|---|---|
| Si-InAlGaAs | 65 |
| SLS2 (InGaAs/GaAs) 2DEG | 64a |
| SLS1 (InAlGaAs /AlGaAs) | 63 |
| GaAs | 62 |
| Si | 61 |

FIG. 10(C)

| | |
|---|---|
| SLS3 (Si-InAlGaAs / AlGaAs) | 65a |
| SLS2 (InGaAs/GaAs) 2DEG | 64a |
| SLS1 (InAlGaAs/AlGaAs) | 63 |
| GaAs | 62 |
| Si | 61 |

FIG. 10(D)

| | | |
|---|---|---|
| | Si-InAlGaAs | 65 |
| | SLS3 (InAlGaAs /AlGaAs) | 65a |
| 64 or 64a | SLS2 (InGaAs /GaAs) 2DEG  or  InGaAs 2DEG | 64 |
| | SLS1 (InAlGaAs /AlGaAs) | 63 |
| | GaAs | 62 |
| | Si | 61 |

Y = 0.05

Y = 0.1

COMPOUND SEMICONDUCTOR DEVICE CONSTRUCTED ON A HETEROEPITAXIAL SUBSTRATE

This application is a continuation of application Ser. No. 08/133,242 filed Oct. 8, 1993, now abandoned.

BACKGROUND OF THE INVENTION

The present invention generally relates to semiconductor devices, and more particularly to a compound semiconductor device constructed on a compound semiconductor layer that in turn is provided on a silicon substrate.

Compound semiconductor devices such as HEMT or MESFET are characterized by extremely high operational speed associated with the high carrier mobility of compound semiconductor materials, and are used in various high speed applications wherein a high operational speed of the device is demanded.

Conventionally, such compound semiconductor devices are constructed on a wafer which is sliced from an ingot of a single crystal semiconductor material. On the other hand, the growth of such a compound semiconductor ingot is substantially more difficult as compared with the growth of a silicon ingot, and because of this, there has been a problem in that the fabrication cost of compound semiconductor devices is generally much higher than that of silicon devices. Particularly, the diameter of the compound semiconductor wafer currently available is limited to 4 inches or less, which is substantially smaller than the diameter of silicon wafers. Today, a silicon wafer having a diameter of 8 inches is readily available. In addition to the foregoing problems, the wafer of compound semiconductor materials is heavy and brittle, and handling of the same is much more difficult than silicon wafers.

In order to reduce the cost of compound semiconductor devices, use of a heteroepitaxial substrate has been proposed, wherein a layer of a compound semiconductor material is grown epitaxially on a silicon water.

In such a heteroepitaxial substrate, however, there arises various difficulties particularly when foaming an epitaxial layer of a compound semiconductor material with a quality suitable for use as an active layer of a semiconductor device. For example, the lattice constant of the compound semiconductor material forming the epitaxial layer is generally very much different from the lattice constant of silicon. It should be noted that silicon has a lattice constant of 5.43 Å, while GaAs, a typical III–V compound semiconductor material, has a lattice constant of 5.65 Å. Further, there exists a large difference in the thermal expansion coefficient between the epitaxial layer and the silicon substrate. As a result of such a misfit in the lattice constant and in the thermal expansion coefficient, a simple epitaxial growth of the compound semiconductor layer directly on the silicon substrate has been generally unsuccessful. Although this problem was eventually worked out by depositing a buffer layer of a compound semiconductor material on the silicon substrate in the amorphous state prior to the epitaxial growth of the compound semiconductor layer that acts as the active layer of the semiconductor device, the active layer thus obtained generally suffers from the problem of high dislocation density.

In order to reduce the dislocations in the active layer as much as possible, various efforts have been made so far. FIG. 1 shows an example of such an effort, wherein a strained superlattice structure is interposed between a compound semiconductor active layer and a buffer layer that covers the silicon substrates Referring to FIG. 1 showing a conventional heteroepitaxial substrate, a GaAs buffer layer 12 is deposited epitaxially on a silicon substrate 11 initially in the amorphous state and then in the crystallized state, and a strained superlattice structure 13 is formed on the GaAs layer 12 for intercepting and deflecting the dislocations that are created at the interface between the silicon substrate 11 and the GaAs buffer layer 12 as indicated by a broken line in FIG. 1. It should be noted that the GaAs buffer layer 12, which has been deposited initially in the amorphous state, crystallizes during the deposition process of the strained superlattice structure 13 due to the elevated temperature employed for the deposition, and the dislocations are created as a result of the large misfit in the lattice constant between the silicon substrate 11 and the GaAs buffer layer 12.

In order to intercept the dislocations thus created and to deflect or trap the same such that the dislocations do not penetrate into an active layer 14 grown on the structure 13, the strained superlattice structure 13 includes an alternate repetition of a GaAs layer element formed of a thin GaAs layer and an InGaAs layer element formed of a thin InGaAs layer such that a stress develops at the interface between the GaAs layer element and the InGaAs layer element due to the large discrepancy in the lattice constant between the GaAs layer element and the InGaAs layer element. Typically, the InGaAs layer element contains the InAs component with a mole ratio of 10%. In such a strained superlattice structure, the thicknesses of the GaAs layer element and the InGaAs layer element are set below a critical thickness above which dislocations appear in the GaAs or InGaAs layer element as a result of the misfit of the lattice constant. It should be noted that the stress thus created in the strained superlattice structure 13 acts to absorb or deflect the dislocations propagating from the underlying GaAs buffer layer, and the penetration of the dislocations through the superlattice structure 13 into a GaAs active layer 14 provided thereon is effectively intercepted. Thereby, the dislocation density in the active layer 14 is substantially reduced, and active devices formed thereon operate properly similarly to those devices constructed on a bulk crystal substrate. The use of such a strained superlattice structure for intercepting the dislocations is described in Fischer et al. (Fischer, R., Neumann, D., Zabel, H., Morkoo, H., Choi, C, and Otsuka, N., Applied Physics Letters 48, p.1223, 1986), which is incorporated herein by reference.

FIG. 2 shows another conventional construction described in Tamura et al. (Tamura, M., Hashimoto, A., Sugiyama, N., J. Apply. Phys., 70, pp.4770, 1991) for intercepting dislocations in the heteroepitaxial substrate. Referring to FIG. 2, the heteroepitaxial substrate includes a GaAs buffer layer 22 corresponding to the GaAs buffer layer 12 of FIG. 1, wherein the buffer layer 22 is deposited on a silicon substrate 21 corresponding to the silicon substrate 11 or FIG. 1. Further, an InGaAs layer 23 is deposited on the GaAs buffer layer 22 as an active layer of a semiconductor device. In order to avoid the formation of dislocations in the layer 23, the layer 23 of FIG. 2 has a thickness smaller than the foregoing critical thickness above which the layer 23 experiences formation of dislocations, In the example described in the foregoing reference, the buffer layer 22 has a thickness of about 2.2 $\mu$m, while the InGaAs layer 23 has a thickness of about 0.8 $\mu$m. In order to obtain a critical thickness for the layer 23 which is large so that the layer 23 has a thickness smaller than the critical thickness, the content of InAs in the layer 23 is held within 1% in terms of mole fraction. It should be noted that the critical thickness of the layer 23 is larger than 1 $\mu$m when the InAs content of the layer 23 is set to the foregoing value of 1%.

When the total thickness of the InGaAs layers in the strained superlattice structure 13 or the thickness of the InGaAs layer 23 exceeds the foregoing critical thickness there occurs a formation of dislocations at the interface between the InGaAs layer and the adjacent GaAs layer as already mentioned. Further, there occurs a problem of so-called cross-hatch pattern on the surface of the InGaAs layer wherein the surface of the InGaAs layer is undulated with a regular pitch in correspondence to the dislocation lines that form a criss-cross pattern at the interface of the GaAs layer and the InGaAs layer with a uniform mutual separation.

Although the construction of FIG. 1 or FIG. 2 is effective for reducing the dislocation density in the active layer 14 or 23, such a heteroepitaxial substrate tends to show a warp because of the large difference in the thermal expansion coefficient between the compound semiconductor layer and the silicon substrate. For example, GaAs has a thermal expansion coefficient which is about three times as large as that of silicon. In the structure of FIG. 1, therefore, the GaAs active layer 14 deposited at the temperature of about 700° C. experiences a much larger thermal shrinkage as compared with the silicon substrate 11 upon cooling, and as a result of such a thermal shrinkage, the substrate 11 is curved so that it has a concave upper principal surface and a corresponding convex lower principal surface. In the conventional substrates having small diameters such as 3 inches or less, this problem of warp of the substrate has not been a substantial problem. However, in future heteroepitaxial substrates having a large diameter such as 6 inches or 8 inches, such a warp causes a problem particularly when mounting the substrate on a holder by a vacuum chucking mechanism, as the magnitude of the warp increases with the square of the diameter of the substrate. In the 6 inches wafers, it is estimated that the magnitude of warp reaches as much as 100 $\mu$m.

SUMMARY OF THE INVENTION

Accordingly, it is a general object of the present invention to provide a novel and useful compound semiconductor device constructed on a heteroepitaxial substrate wherein the foregoing problems are eliminated.

Another and more specific object of the present invention is to provide a compound semiconductor device constructed an a heteroepitaxial substrate, comprising:

a silicon substrate having upper and lower major surfaces;

a first compound semiconductor layer of a first compound semiconductor material having upper and lower major surfaces separated from each other by a first thickness, said first compound semiconductor layer being provided on said silicon substrate, said first compound semiconductor material having a first lattice constant;

a second compound semiconductor layer of a second compound semiconductor material having upper and lower major surfaces separated from each other by a second thickness, said second compound semiconductor layer being provided on said first compound semiconductor layer, said second compound semiconductor material having a second lattice constant substantially larger than said first lattice constant, said second thickness being set substantially larger than a critical thickness above which dislocations develops in said second compound semiconductor layer; and an active semiconductor device constructed on said second compound semiconductor layer such that said second compound semiconductor layer acts as a part of said active semiconductor layer;

wherein said dislocations are substantially confined in the vicinity of an interface between said first compound semiconductor layer and said second compound semiconductor layer.

According to the present invention, the silicon substrate experiences a warp during the process for forming said second compound semiconductor layer, because of the large lattice constant of the second compound semiconductor layer as compared with the lattice constant of the first compound semiconductor layer and because of the large thickness of the second compound semiconductor layer that exceeds the foregoing critical thickness, such that the lower major surface of said silicon substrate forms a concave, depressed surface. In correspondence to the concave lower major surface, the upper major surface of the silicon substrate and hence the upper major surfaces of the first and second compound semiconductor layers form a corresponding convex, projecting surface. When the temperature is lowered to room temperature or to a temperature at which the semiconductor device is operated, the first as well an the second compound semiconductor layers experience a large thermal shrinkage that exceeds the thermal shrinkage of the silicon substrate, An a result, the heteroepitaxial substrate, which includes the silicon substrate as well as the first and second compound semiconductor layers, experiences a warp which cancels out the preexisting warp that has caused the upper major surface of the second compound semiconductor layer to form the convex surface.

In the heteroepitaxial substrate thus formed, it has been found experimentally that the dislocations, of which formation in the second compound semiconductor layer is expected because of the large misfit in the lattice constant between the first compound semiconductor layer and the second compound semiconductor layer and because of the large thickness of the second compound semiconductor layer which exceeds the critical thickness, are snore or less confined at the interface between the first and second compound semiconductor layers. Thus, there is no substantial influence in the operation of the active devices constructed on the second compound semiconductor layer by the dislocations that are formed in the second compound semiconductor layer.

In a preferred embodiment of the present invention, the second compound semiconductor layer includes a strained superlattice structure therein.

In another aspect of the present invention, it has been discovered also experimentally that the second compound semiconductor layer thus deposited with the thickness exceeding the critical thickness is effective for developing a stress at the interface between the first and second compound semiconductor layers and hence at the interface between the first compound semiconductor layer and the silicon substrates such that the warp of the silicon substrate is canceled out upon cooling, contrary to a pessimistic speculation that a large amount of dislocations in the second compound semiconductor layer in such a heteroepitaxial substrate would inevitably relax the stresses within the second compound semiconductor layer rather than developing a counter-acting thermal stress to cancel out the warp of the silicon substrate.

Thus, according to the present invention, one can construct a heteroepitaxial substrate on a large diameter silicon substrate without degrading the quality of the compound semiconductor layer provided on the heteroepitaxial substrate or causing a warp in the heteroepitaxial substrate.

Other objects and further features of the present invention will become apparent from the following detailed description when read in conjunction with the attached drawings.

BRIEF DESCRIPTION OF THE DRAWINGS

FIGS. 10(A)–10(D) are diagrams showing various heteroepitaxial substrates according to a third embodiment of the present invention;

DETAILED DESCRIPTION OF THE PREFERRED EMBODIMENT

First, the experimental basis of the present invention will be described with reference to FIGS. 12 and 13 as well as with reference to FIGS. 3–5.

The inventor of the present invention has conducted a series of experiments with regard to the warp of heteroepitaxial substrates and the dislocations that are formed in such a heteroepitaxial substrate. In the experiment, a GaAs layer is deposited on a silicon substrate an a buffer layer, and an InGaAs layer is grown epitaxially an such a GaAs buffer layer as an active layer, wherein the warp of the heteroepitaxial substrate thus obtained is measured for various combinations of the diameter and thickness of the silicon substrate, the thickness of the GaAs layer, and the thickness and composition of the InGaAs layer.

Figure 3:
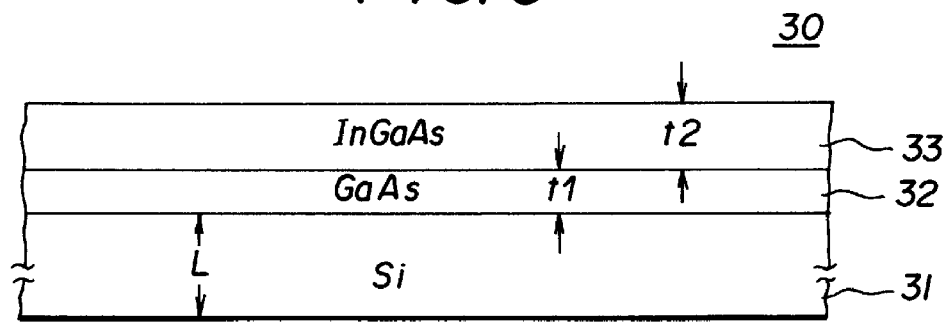
FIG. 3 is a diagram showing the principle of the present invention.

FIG. 3 shows the cross sectional structure of such a heteroepitaxial substrate 30, wherein a GaAs buffer layer 32 having a thickness $t_1$ is deposited on a silicon substrate 31 having a thickness L, and an InGaAs layer 33 is deposited on the layer 32 with a thickness $t_2$. As usual in the art, the GaAs buffer layer 32 is formed on the silicon substrate 31 initially in the amorphous state with a thickness of about 20 nm by a CVD process conducted at 400°–450° C. followed by a deposition of a crystalline GaAs layer at a temperature of 690° C. Further, An InGaAs layer 33 is deposited on the GaAs buffer layer 32 also by a CVD process At the temperature of 690° C. In the present experiment, the deposition of the layers 32 and 33 was carried out on the silicon substrate 31 having various diameters D and various thicknesses L, while changing the parameters D, L, $t_1$ and $t_2$.

Figure 4A:
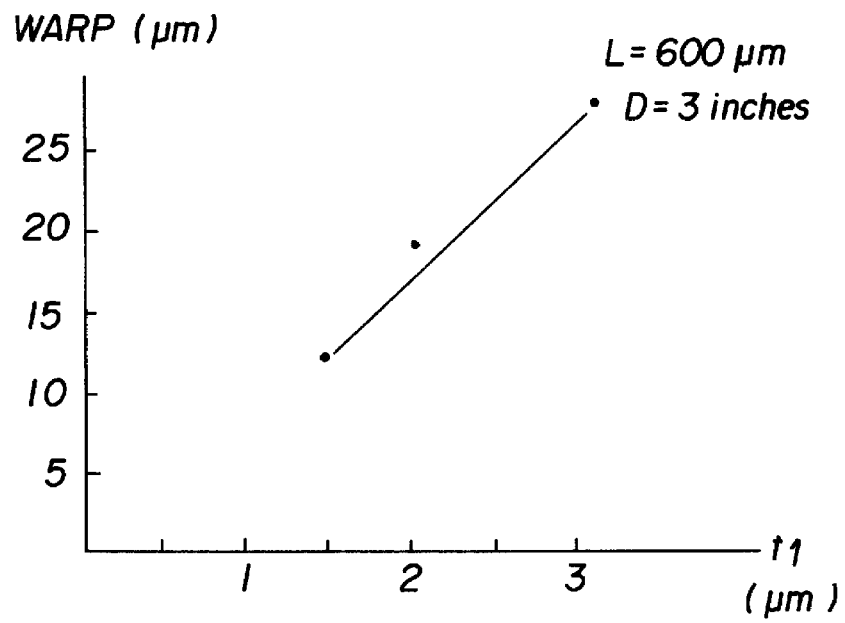
FIGS. 4(A) and 4(B) are diagrams showing the experimental data on warp obtained for the heteroepitaxial substrate of FIG. 3.
Figure 4B:
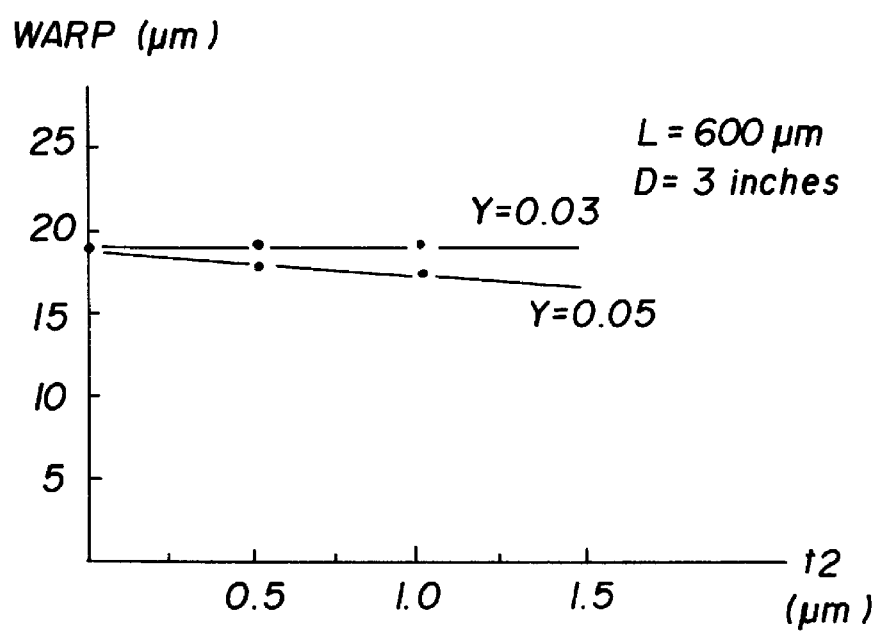

FIGS. 4(A) and 4(B) show the result of the experiments thus carried out, respectively representing the relationship between the warp of the heteroepitaxial substrate 30 and the thickness $t_1$ of the GaAs buffer layer 32 and the relationship between the warp of the heteroepitaxial substrate 30 and the thickness $t_2$ of the InGaAs layer 33, wherein the layer 33 contains 3% or 5% of the InAs component therein in terms of mole fraction in the diagram of FIG. 4(B). From the relationship of FIGS. 4(A) and 4(B), a mathematical representation of the magnitude of the warp $\delta$ is derived empirically as being $$\delta = 7.78 \times 10^3 [1.21 \times 10^{-3}(t_1+t_2) - 0.071 xy \cdot \alpha \cdot t_2] \times (D/3)' \times (600/L)', \quad (1)$$

wherein the warp $\delta$ is expressed in microns, the parameter $\alpha$ represents an empirical coefficient of curve fitting, and the parameter y represents the InAs content in the InGaAs layer 33 of which the composition is represented as $In_yGa_{1-y}As$. The positive value and the negative value of the warp $\delta$ in the foregoing relationship represent respectively the positive and negative curvatures of the upper major surface of the heteroepitaxial substrate 30. When the warp $\delta$ is positive, the upper major surface of the substrate 30 forms a concave surface, while when the warp $\delta$ is negative, the upper major surface of the substrate 30 forms a convex surface. It seems that the parameter $\alpha$ depends on the temperature off growth, thermal history, and the thickness of the layers. At present, however, the quantitative representation of the parameter $\alpha$ as a function of these parameters is not well established. For the heteroepitaxial substrate 30 wherein the InGaAs layer 33 is formed with a thickness of 1 µm at the deposition temperature or 690° C. and with the InAs content of 5% (y=0.05), the parameter $\alpha$ has a value of 0.38. On the other hand, for the heteroepitaxial substrate 30 wherein the InAs content in the InGaAs layer 33 is 3% (y=0.03), the parameter $\alpha$ has a value of 0.55. It should be noted that the term $\delta$ shown in Eq.(1) represents the value of the warp of the substrate 30 in the state that the heteroepitaxial substrate 30 is cooled to the room temperature after deposition of the InGaAs layer 33.

In FIG. 4(A), it should be noted that the warp $\delta$ increases generally linearly with the thickness $t_1$ of the GaAs layer 32, while FIG. 4(B) shows a remarkable relationship in that there is no substantial increase in the warp $\delta$ even when the thickness $t_2$ of the InGaAs layer 33 increases.

Based upon the relationship of Eq.(1), one can obtain the warp $\delta$ for a desired combination of the parameters D, L, $t_1$ and $t_2$. For example, a warp $\delta$ of +113 µm is obtained for a set of parameters: D=6 inches; L=600 µm; $t_1$=3 µm; and $t_2$=0 µm; wherein the last condition of $t_2$=0 of course corresponds to the nonexistence of the InGaAs layer 33. It should be noted that the foregoing value of 113 µm for the warp of the heteroepitaxial substrate 30 is too large for the substrate 30 to be mounted upon a vacuum suction holder for processes such as the photolithographic patterning processes. Obviously, such a warp is caused as a result of the thermal shrinkage of the GaAs layer 32 on the silicon substrate 31 that exceeds the thermal shrinkage of the silicon substrate 31.

When the InGaAs layer 33 is provided on the GaAs layer 32 with the InAs content of 5% (y=0.05) and the thickness $t_2$ of 1 µm, on the other hand, the warp $\delta$ of the heteroepitaxial substrate 30 becomes 76 µm at room temperature, provided that the thickness $t_1$ of the GaAs buffer layer 32 is set to 2 µm and the substrate 31 has the diameter D and the thickness L respectively set to 6 inches and 600 µm. It should be noted that the foregoing value of 76 µm for the warp $\delta$ is sufficiently small for mounting the heteroepitaxial substrate 30 to be mounted upon a holder for the lithographic patterning processes. When the InGaAs layer 33 has the InAs content of 3% (y=0.03), on the other hand, the warp δ becomes 76 μm, again small enough for the subsequent processes.

Thus, by providing the InGaAs layer 33 that has a lattice constant exceeding the lattice constant of the GaAs layer 32 with a thickness exceeding the critical thickness, it will be understood that the warp of the heteroepitaxial substrate is successfully reduced. It is believed that this desirable effect is obtained due to the large lattice constant of the InGaAs layer 33 that causes a counter-acting warp in the substrate 31 at the time when the layer 33 is deposited at an elevated temperature. This counter-acting warp is effectively canceled out by the shrinkage of the layer 33 that would otherwise cause a warp occurring usually in the conventional heteroepitaxial substrates.

It should be noted that the foregoing thickness $t_2$ of the InGaAs layer 33 substantially exceeds the critical thickness above which dislocations develop within the layer 33 due to the large misfit in the lattice constant between the InGaAs layer 33 and the underlying GaAs layer 32. In the heteroepitaxial substrate 30 wherein the InGaAs layer 33 contains the InAs component with the mole ratio of 10% (y=0.1), it should be noted that the critical thickness of the InGaAs layer 33 is about 15 nm. When the InAs content is 5% (y=0.05), on the other hand, the critical thickness of the layer 33 is about 27 nm. Further, when the layer 33 contains the InAs component with the mole ratio of 3% (y=0.03), the critical thickness of the InGaAs layer 33 takes a value of about 100 nm.

Because of the fact that the thickness of the InGaAs layer 33 exceeds the critical thickness and because of the fact that the InGaAs layer 33 has a lattice constant substantially larger than that of the GaAs layer 32, the InGaAs layer 33 exerts a tensile stress upon the underlying GaAs layer 32 and hence the silicon substrate 31. This in turn indicates that the InGaAs layer 33 experiences a strong compressive stress, and it is predicted that such a large compressive stress in the layer 33 may cause an extensive creation of dislocations within the layer 33. Such dislocations are of course undesirable to the proper operation of active devices that are provided on the InGaAs layer 33. Further, such dislocations tend to diminish the effect of the InGaAs layer 33 to induce the foregoing counter-acting warp by relaxing the stress at the dislocations. Thus, when there exists ouch an extensive formation of dislocations in the InGaAs layer 33, there is a possibility that the desired formation of the counter-acting warp may not be obtained.

Figure 1:
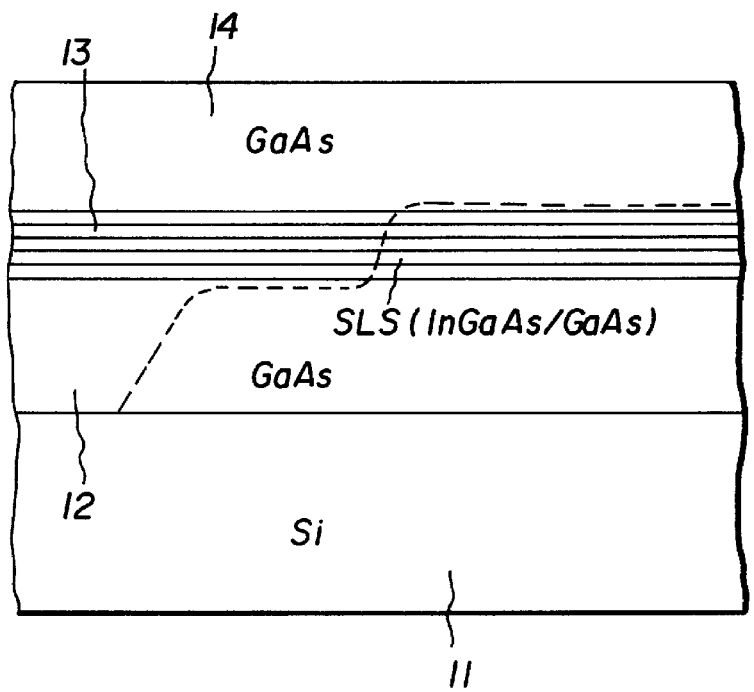
FIG. 1 is a diagram showing the interception of dislocations in a conventional heteroepitaxial substrate that uses a strained superlattice structure.
Figure 2:
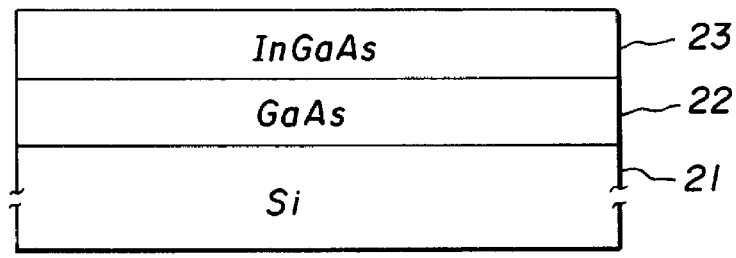
FIG. 2 is a diagram showing another conventional heteroepitaxial substrate.
Figure 12:
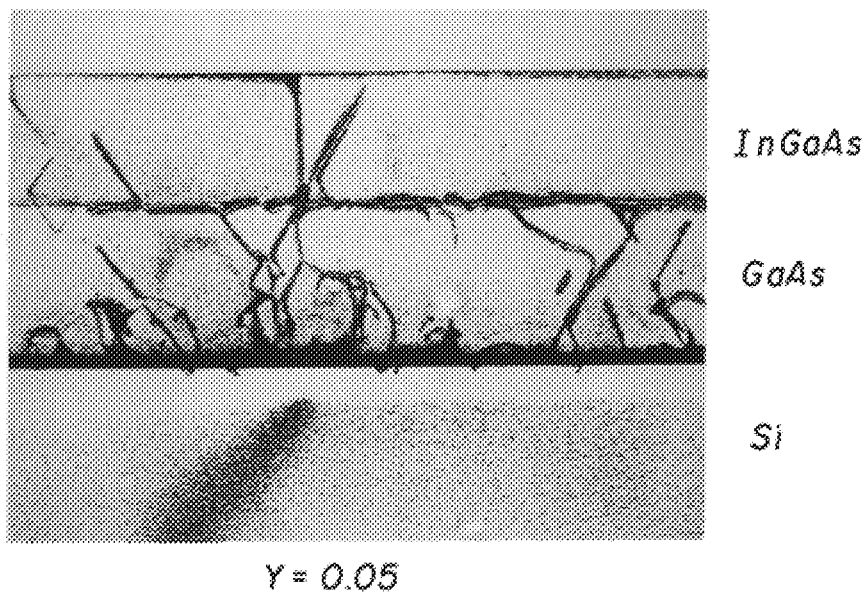
FIGS. 12 and 13 are photographs showing the dislocation density in the heteroepitaxial substrate of FIG. 3.
Figure 13:
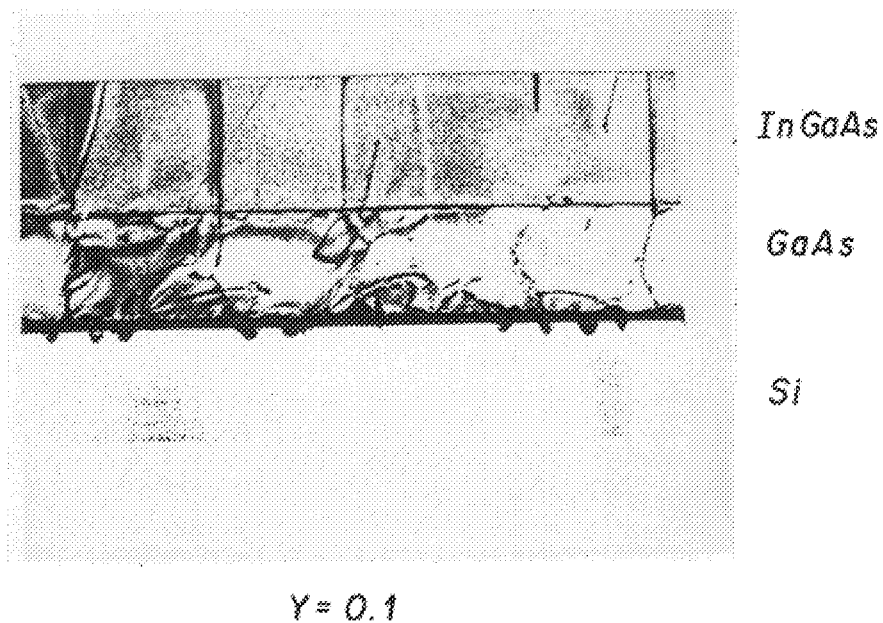

FIGS. 12 and 13 are TEM photographs showing the dislocations that are created in the heteroepitaxial substrate 30 of FIG. 1, wherein FIG. 12 shows a case wherein the GaAs layer 32 is grown on the silicon substrate 31 (D=3 inches, L=600 μm) with the thickness $t_1$ of 0.7 μm and wherein the InGaAs layer 33 having a composition $In_{0.05}Ga_{0.95}As$ (y=0.05) is grown further on the GaAs layer 32 with the thickness $t_2$ of 0.5 μm. On the other hand, FIG. 13 shows a case wherein the GaAs layer 32 is grown on the silicon substrate 31 (D=3 inches, L=600 μm) with the thickness $t_1$ of 0.5 μm and wherein the InGaAs layer 33 having a composition $In_{0.1}Ga_{0.9}As$ (y=0.1) is grown further on the GaAs layer 32 with the thickness $t_2$ of 0.5 μm. In the structure of FIGS. 12 and 13, the GaAs layer 32 is deposited on the silicon substrate 31 with a thickness of about 20 nm initially at a temperature of 450° C. and then at 690° C. by supplying TMG and arsine simultaneously, while the InGaAs layer 33 is grown on the GaAs layer 33 at a temperature of 690° C. while supplying TMG, TMI and arsine simultaneously. The deposition of the layers 32 and 33 is achieved in an evacuated reaction vessel under a pressure of $10^{-5}$ Pa. When growing the InGaAs layer 33 in the structure of FIG. 12, the flowrates or TMG and TMI are set to 20 SCCM and 14 SCCM respectively, while the flowrate of arsine is set to 270 SCCM. In the structure of FIG. 13, the InGaAs layer 33 is formed by supplying TMG and TMI with respective flowrates of 20 SCCM and 29 SCCM while supplying arsine at the flowrate of 270 SCCM.

It should be noted, from any of FIGS. 12 and 13, that there is extensive formation of dislocations within the GaAs buffer layer 32 as represented by dark patterns due to the large discrepancy in the lattice constant between GaAs and silicon as is well known in the art, while there in very little formation of dislocations in the InGaAs layer 33 particularly for those dislocations that penetrate through the layer 33 and reach the upper major surface of the layer 33. Surprisingly, the majority of the dislocations originating at the interface of the layer 32 and 33 are confined in the vicinity of the interface and do not propagate in the upward direction toward the upper major surface of the layer 33. Thus, the InGaAs layer 33 thus formed has a quality sufficient for constructing an active device thereon.

Meanwhile, it is known that a heteroepitaxial structure such as the heteroepitaxial substrate 30 of FIG. 3 tends to show a cross-hatch pattern mentioned previously at the surface of the layer 33 in correspondence to the dislocation lines formed at the heteroepitaxial surface between the InGaAs layer and the GaAs layer. Such a cross hatch pattern increases the surface roughness of the heteroepitaxial substrate. When the surface undulation exceeds about 30 μm, the device fabrication process is affected, FIG. 5 shows the relationship between the irregularity that occurs in the surface of the InGaAs layer 33 thus formed, as a function of the thickness $t_2$ of the layer 33. In the present experiments, the surface irregularity of the InGaAs layer 33 was measured by an atomic force microscope (AFM) after the layer 33 is grown on the GaAs layer 32 and cooled subsequently to room temperature.

Figure 5:
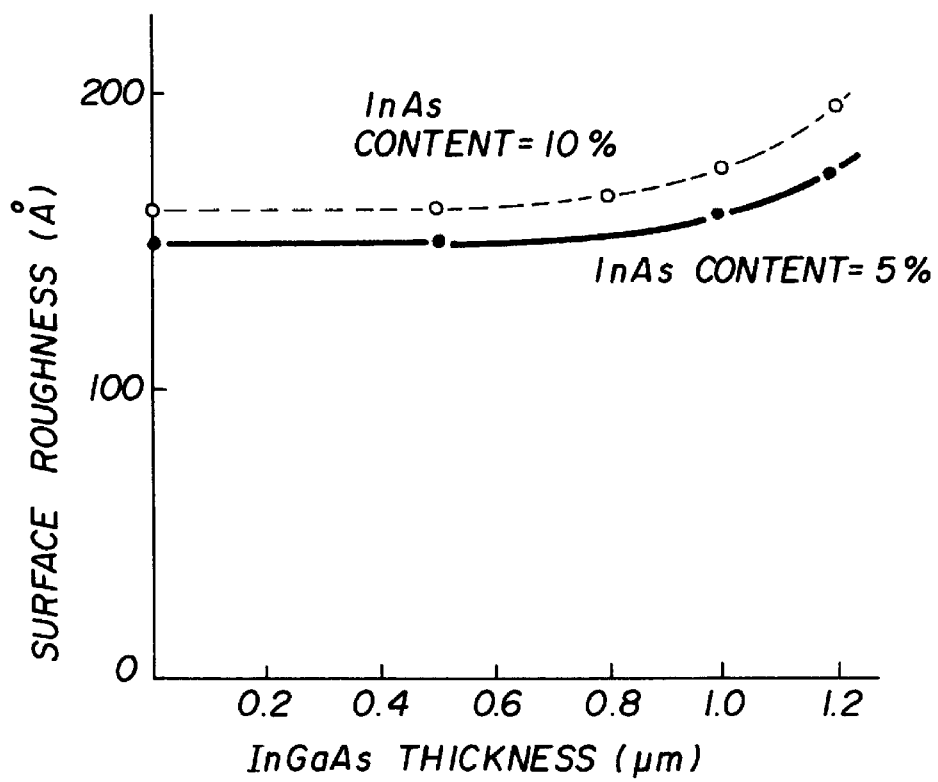
FIG. 5 is a diagram showing the cross hatching caused in the heteroepitaxial substrate of FIG. 3.

Referring to FIG. 5, it will be noted that the surface roughness remains in the order of 150 Å in correspondence to the rough surface of the GaAs layer 32 deposited on the silicon substrate 32, as long as the thickness $t_2$ of the InGaAs layer 33 is held within the range of about 1 μm. In the foregoing range of the thickness $t_2$, the surface roughness increases slightly with increasing InAs content in the layer 33 as represented by continuous and broken lines, wherein the continuous line represents the surface roughness for the structure wherein the InGaAs layer 33 contains 5% of the InAs content while the broken line represents the surface roughness of the structure wherein the InGaAs layer 33 contains 10% of the InAs content. In any of the structures, the surface roughness starts to increase steeply when the thickness $t_2$ exceeds the foregoing threshold thickness of about 1 μm.

The result of FIG. 5 indicates that the foregoing heteroepitaxial substrate 30 can provide a satisfactory surface roughness as long as the InAs content is held within 5% in the InGaAs layer 33 and as long as the thickness of the layer 33 is held within about 1 μm. Further, the foregoing construction of the heteroepitaxial substrate as shown in FIG. 3 is effective also for reducing the warp in other compound semiconductor systems without creating dislocations or cross hatch patterns. For example, one may replace the InGaAs layer 33 of FIG. 3 by an InGaP layer or an InAlGaP layer or a stacking of an InGaP/InAlGaP layer, wherein in the InP content in the InGaP layer is set to 50% or more.

Alternatively, one may use an InAlGaP layer in place of the InGaAs layer 33.

The discovery of the inventor of the present invention outlined above has lead to the present invention wherein the warp is reduced and the dislocation density in the active layer of a semiconductor device is suppressed simultaneously. When using such a heteroepitaxial substrate for a HEMT in particular, which includes: a high resistance buffer layer having a large band gap provided on a GaAs buffer layer which in turn covers the surface of a silicon substrate; an active layer provided on the high resistance buffer layer in which a two dimensional electron gas is formed; and an electron supplying layer provided on the active layer for supplying electrons to the active layer to form the foregoing two dimensional electron gas, one obtains a guideline for designing the layered structure of the device including the heteroepitaxial substrate, as follows.

(1) Each of the high resistance buffer layer, the active layer and the electron supplying layer should have a lattice constant exceeding the lattice constant of the GaAs buffer layer. Thereby, a warp is caused intentionally in the heteroepitaxial substrate so as to cancel out the warp caused as a result of the thermal shrinkage.

(2) The thickness of the high resistance buffer layer or the total thickness of the high resistance buffer layer and the active layer should exceed the critical thickness of the dislocation formation in the high resistance buffer layer and hence in the active layer. Thereby, the dislocations are confined at the interface between the GaAs buffer layer and the high resistance buffer layer and one can reduce the dislocation density in the high resistance buffer layer and hence in the active layer.

(3) The difference in the lattice constant between the active layer and the electron supplying layer should be set substantially small such that no substantial formation of dislocations occurs at the interface between the active layer and the electron supplying layer.

(4) The total thickness of the high resistance buffer layer, the active layer and the electron supplying layer should be equal to or smaller than about 1 $\mu$m in order to suppress the formation of the cross hatch pattern.

Figure 6:
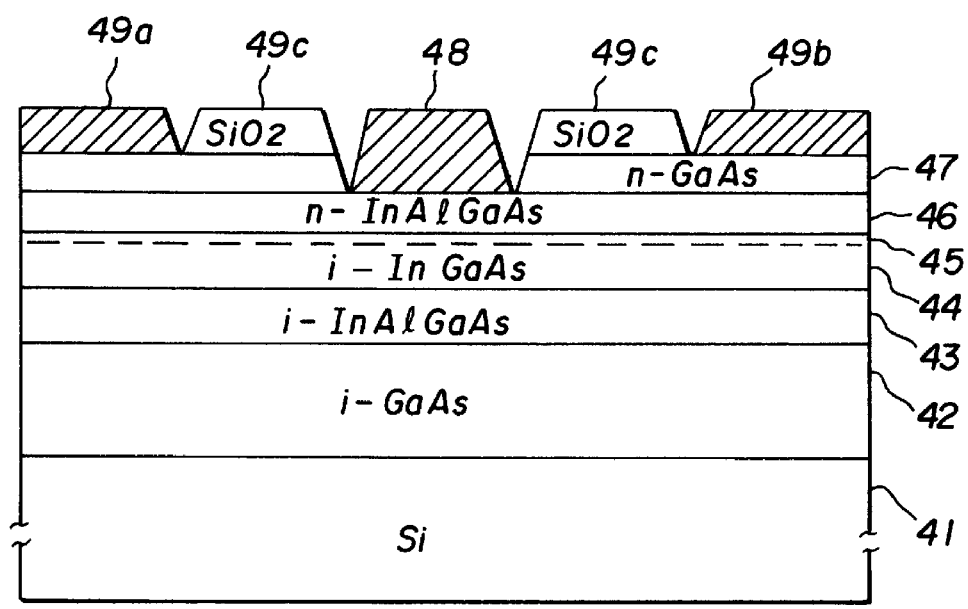
FIG. 6 is a diagram showing a HEMT constructed on a heteroepitaxial substrate according to a first embodiment of the present invention.

Next, a first embodiment of the present invention will be described with reference to FIG. 6 showing a typical HEMT constructed an a heteroepitaxial substrates Referring to FIG. 6, the heteroepitaxial substrate includes a silicon substrate 41 having a thickness of 600 $\mu$m and a diameter of 3 inches, and a first buffer layer 42 of undoped GaAs is deposited an the substrate 41 by an MOCVD process with a thickness of 1 $\mu$m. Further, a second buffer layer 43 of undoped InAlGaAs having a composition of $In_{0.05}(Al_{0.3}Ga_{0.7})_{0.95}As$ is deposited on the first buffer 42 with a thickness of 0.4 $\mu$m, wherein the buffer layer 42 has a large bandgap and provides an electric isolation to the structures that are provided thereon. Thereby, the silicon substrate 41 as well as the buffer layers 42 and 43 form a heteroepitaxial substrate. It should be noted that the layers 42 and 43 maintain an epitaxial relationship with respect to the substrate 41.

On the buffer layer 43, an active layer 44 of undoped InGaAs having a composition $In_{0.05}Ga_{0.95}As$ is deposited epitaxially also by an MOCVD process with a thickness of 0.4 $\mu$m, and an electron supplying layer 46 of n-type InAlGaAs having a composition of $In_{0.05}(Al_{0.3}Ga_{0.7})_{0.95}As$ is deposited further on the active layer 44 epitaxially with a thickness of 50 nm. The layer 46 is doped by silicon with a carrier density of $1.5\times10^{18}$ cm$^{-3}$ and supplies electrons to the active layer 44, wherein the electrons thus supplied form a two-dimensional electron gas 45 in the layer 44 along the interface between the layer 44 and the layer 46 as is usual in the HEMT. On the electron supplying layer 46, a cap layer 47 of n-type GaAs is deposited epitaxially with a thickness of 50 nm, wherein the cap layer 47 is doped by silicon with a carrier concentration level of $2\times10^{18}$ cm$^{-3}$.

Further, the GaAs cap layer 41 is etched selectively with respect to the underlying InAlGaAs layer 46 in correspondence to the part wherein the gate structure of the HEMT is to be formed, such that the upper major surface of the layer 46 is exposed, and a Schottky electrode 48 is provided on the InAlGaAs layer 46 thus exposed as the gate electrode of the HEMT. Further, ohmic electrodes 49b and 49a are provided on the upper major surface of the GaAs cap layer 47 at both lateral sides of the gate electrode 48 as the source and drain electrodes. Further, the exposed surface of the cap layer 47 is covered by a silicon oxide protection layer 49c.

In the foregoing structure, it should be noted that each of the layers 43–46 has a lattice constant substantially exceeding the lattice constant of the GaAs buffer layer 42, and the total thickness of the layers 43–46 exceeds the critical thickness above which dislocations are induced in the layers 43–46. More particularly, the layers 43–46 having a similar InAs content has a similar lattice constant and hence can be regarded as a single layer provided on the GaAs buffer layer 42. Thus, the epitaxial layers 43–46 exert a strong tensile stress upon the GaAs buffer layer 42 and hence the silicon substrate 41 provided underneath the layer 42 upon deposition to cause a warp in the silicon substrate 41 such that the lower major surface of the substrate 41 shows a concave surface. Upon cooling to room temperature, such a warp of the substrate 41 is canceled upon as a result of the large thermal shrinkage of the epitaxial layers 43–46.

In the experiment that uses a silicon substrate having a diameter and a thickness of 3 inches and 600 $\mu$m respectively for the substrate 41, a warp of 8.3 $\mu$m was observed. The conventional structure that lacks In in the layer 43, on the other hand, shows a warp of 18 $\mu$m. This indicates that a reduction of the warp of as much as 46% is achieved by the construction of FIG. 6 as compared with the conventional structure. In this case, not only the layer 43 but also the layers 44 and 45 that contain InAs contribute to the cancellation of the warp. This means that a similar effect is obtained even when the thickness of the individual epitaxial layers 43–46 is changed, as long as a sufficient total thickness is secured for the layers 43–46. The active layer 44 of the HEMT of FIG. 6 thus formed contains dislocations with a dislocation density of about $10^7$ cm$^{-3}$, such a dislocation density being sufficient for achieving the satisfactory operation of the HEMT.

In the structure of FIG. 6, one can reduce the warp further when the total thickness of the layers 43–46 is increased. However, the relationship in FIG. 5 indicates that there would occur an increase of the cross hatching in the surface of the layers 43–46 when the total thickness exceeds a threshold of about 0.8 $\mu$m. Hereinafter, a second embodiment of the present invention wherein the affect of the cross hatching is minimized while increasing simultaneously the effect of cancellation of the warp, will be described with reference to FIGS. 7(A)–7(C) showing the fabrication process of a HEMT according to the second embodiment.

Figure 7A:
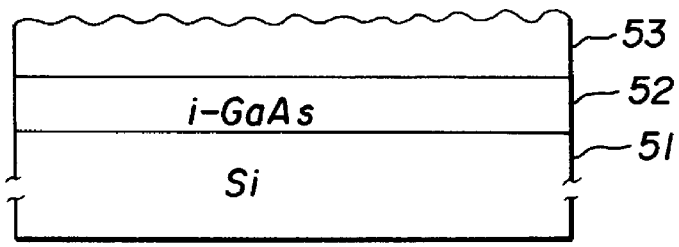
FIGS. 7(A)–7(C) are diagrams showing the process of fabricating a heteroepitaxial substrate according to a second embodiment of the present invention.

Referring to FIG. 7(A), the present embodiment uses a silicon substrate 51 having a diameter or 3 inches and a thickness of 600 $\mu$m similarly to the first embodiment, and a buffer layer 52 of undoped GaAs is deposited on the substrate 51 with a thickness of 1 $\mu$m by an MOCVD process, similarly to the GaAs buffer layer of 42. Further, a second buffer layer 53 of undoped InGaAs having a composition of $In_{0.05}Ga_{0.95}As$ is deposited on the GaAs layer 52 with a thickness of 3 μm, also by an MOCVD process. Because of the large thickness, the InGaAs layer 53 shows a substantial undulation on the upper major surface thereof as a result of the cross hatching as indicated in FIG. 7(A).

Figure 7B:
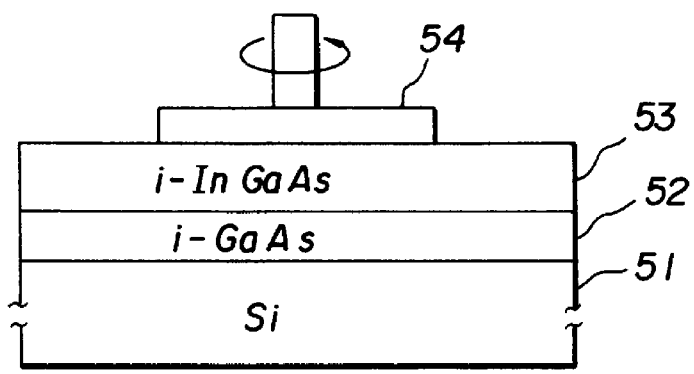
Figure 7C:
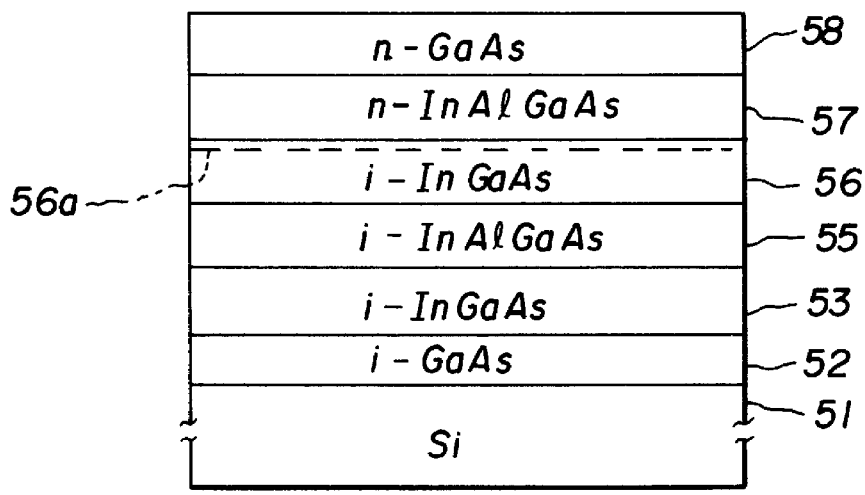

After the layer 53 is grown as such, the substrate 51 including the epitaxial layers grown thereon, is removed from the reaction vessel of the MOCVD apparatus in a step of FIG. 7(B), wherein the undulated upper major surface of the layer 53 is subjected to a polishing process as schematically represented by a numeral 54. Thereby, the surface of the InGaAs layer 53 is mirror-finished within a precision of 1 μm.

The substrate 51 thus processed is then returned to the reaction vessel of the MOCVD apparatus, and a third buffer layer 55 of undoped InAlGaAs having a composition of $In_{0.05}(Al_{0.3}Ga_{0.7})_{0.95}As$ is deposited on the flat upper major surface of the buffer layer 53 by an MOCVD process with a thickness of 0.4 μm. The undoped buffer layer 55 thus deposited contains Al and hence has a large bandgap. Therefore, the layer 55 has a large resistivity and serves for an electric isolation of the active devices that are provided thereon. On the buffer layer 55, an active layer 56 of undoped InGaAs having a composition of $In_{0.05}Ga_{0.95}As$ is deposited also by an MOCVD process with a thickness of 0.4 μm. Further, an electron supplying layer 57 of n-type InAlGaAs having a composition of $In_{0.05}Ga_{0.95}As$ is deposited on the active layer 56 with a thickness of 50 nm, wherein the electron supplying layer 57 is doped by silicon with a carrier concentration level of $1.5 \times 10^{18}$ cm$^{-3}$. Thereby, a two dimensional electron gas 56a is formed in the active layer 66 along an upper major surface thereof. Further a cap layer 58 of n-type GaAs having a carrier concentration level of $2 \times 10^{18}$ cm$^{-3}$ is deposited on the electron supplying layer 57 by an MOCVD process with a thickness of 50 nm, and active parts of the HEMT similar to those shown in FIG. 6 are provided on the heteroepitaxial structure thus formed.

In the present embodiment, the cross hatching originating due to the dislocations that in turn are created as a result of the misfit in the lattice constant between the GaAs buffer layer 52 and the InGaAs buffer layer 53, is successfully eliminated by polishing the upper major surface of the layer 53. Thereby, no cross hatching occurs in the layers 55–57 deposited on the layer 53 because of the excellent lattice matching achieved between these layers. Thus, one can effectively cancel out the warp of the heteroepitaxial substrate on which the HEMT is constructed. On the heteroepitaxial substrate thus formed, a semiconductor device such as a HEMT (not shown) is formed similarly to the embodiment of FIG. 6. Again, the dislocation density in the active part of the HEMT such as the active layer 56 is held below about $10^7$ cm$^{-3}$, and a proper operation of the HEMT is guaranteed.

Next, a third embodiment of the present invention will be described for reducing the warp of the heteroepitaxial substrate further while maintaining a satisfactory quality of the substrate.

In the present embodiment, the inventor of the present invention has conducted a series of experiments to increase the InAs content in the InGaAs layer and simultaneously the total thickness of the layers that contain InAs while suppressing the dislocation density and the cross hatching, by replacing the InGaAs buffer layer by a strained superlattice structure (SLS). Conventionally, the strained superlattice structure has been used for reducing the dislocations in the heteroepitaxial substrates an mentioned earlier. There is no teaching, however, to use the strained superlattice structure to reduce the warp of such a heteroepitaxial substrate.

As already noted in the first and second embodiments, the total thickness of the InGaAs layer that has a larger lattice constant as compared with the GaAs buffer layer is the deciding factor for reducing the warp in the present invention. As demonstrated in the second embodiment, the InGaAs layer is not necessarily a single layer but way include a number of layers including an InAlGaAs layer. Thus, the foregoing first and second embodiments lead to a third embodiment of the present invention wherein the InGaAs layer is replaced by a strained superlattice structure wherein an InGaAs layer is included as a layer element. In the strained superlattice structure of InGaAs and GaAs, it should be noted that each layer element of InGaAs or GaAs has a thickness smaller than the critical thickness and hence experiences no formation of the dislocations. Thus, it is expected that the warp of the heteroepitaxial substrate may be eliminated substantially completely by repeating the stack of the InGaAs and the GaAs layer elements alternately for an arbitrary number of times as long as the total thickness of the In-containing layer does not exceed a critical thickness above which dislocations are induced in the strained superlattice structure.

With the foregoing prospect in mind, the inventor of the present invention has conducted an experiment for reducing the warp on a heteroepitaxial substrate wherein a strained superlattice structure of an InGaAs layer element and a GaAs layer element is interposed between the layer 32 and the layer 33 of FIG. 3.

Figure 8:
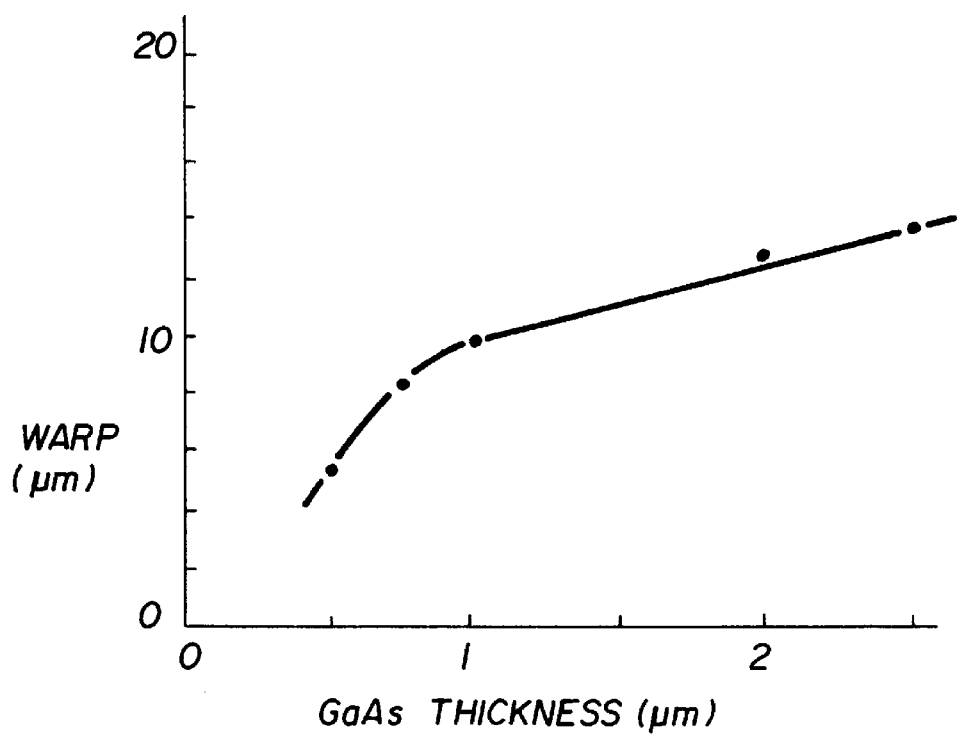
FIG. 8 is a diagram showing the warp of a heteroepitaxial substrate as a function of the thickness of a GaAs buffer layer used therein.

FIG. 8 shows the warp obtained for such a heteroepitaxial substrate that includes the strained superlattice structure as a function of the GaAs buffer layer that is provided underneath the strained superlattice structure. In the experiment, an InGaAs layer element having a composition of $In_{0.15}Ga_{0.85}As$ and a GaAs layer element, each having a thickness of 50 Å, are stacked alternately for one hundred repetitions to form the strained superlattice structure, and the strained superlattice structure thus formed is interposed between the GaAs buffer layer 32 and the InGaAs layer 33 of FIG. 3 as mentioned above. Thereby, the thickness of the GaAs buffer layer 32 underlying the strained superlattice structure is changed as represented in FIG. 8.

As can be seen from FIG. 8, the relationship between the warp and the thickness of the GaAs buffer layer 32 is not linear and the warp decreases suddenly when the thickness of the GaAs buffer layer 32 is set below about 1 μm. Such a relationship is contradictory to the theoretical prediction that predicts a linear, straight relationship between the warp and the thickness of the GaAs buffer layer 32. Therefore, the inventor of the present invention has conducted a more detailed investigation by means of the X-ray diffraction and stress analysis.

Figure 9:
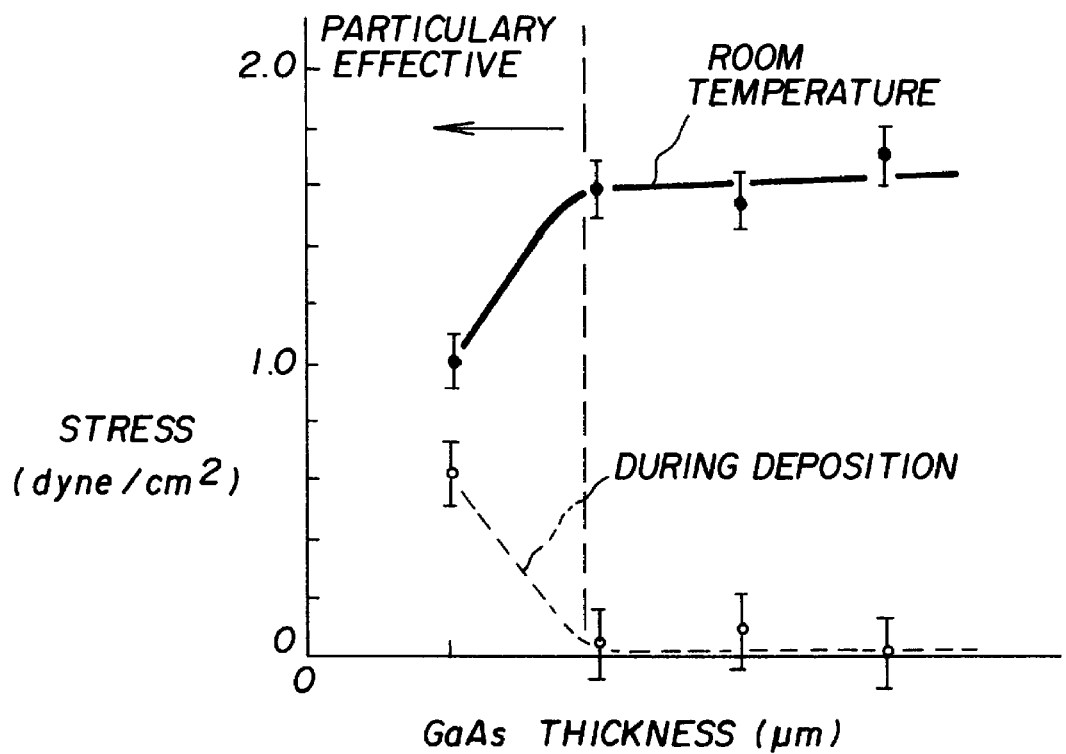
FIG. 9 is a diagram showing a stress accumulated in a GaAs/Si substrate.

FIG. 9 shows the result of the foregoing investigation which is conducted on a simplified heteroepitaxial substrate wherein a GaAs layer is grown on a silicon substrate with various thicknesses. It should be noted that FIG. 9 represents the relationship between the stress and the thickness of a GaAs layer, wherein the broken line represents the relationship during the deposition process wherein the substrate is held at an elevated temperature, while the continuous line represents the relationship after the heteroepitaxial substrate is cooled to room temperature.

It will be noted from FIG. 9 that the GaAs layer exerts a large stress, when the thickness of the layer is below about 1 μm, upon the silicon substrate during the deposition process such that the upper major surface of the substrate forms a convex surface. Such a stress is caused as a result of the large lattice constant of GaAs as compared with silicon. In other words, the GaAs layer exerts the stress on the silicon substrate by a mechanism similar to the InGaAs layer described previously. On the other hand, a GaAs layer on a silicon substrate has a very small critical thickness in the order of several Angstroms because of the very large discrepancy in the lattice constant between GaAs and silicon. Thus, the thickness of the GaAs layer deposited on the silicon substrate inevitably exceeds the critical thickness even if the thickness of the GaAs layer is very small. Thereby, there is an extensive formation of dislocations in the GaAs layer in such a heteroepitaxial structure, and such dislocations tend to cause a relaxation of the stress. This relaxation of the stress proceeds gradually with increasing thickness of the GaAs layer and hence with increasing dislocation density, and once the thickness exceeds the foregoing value of about 1 $\mu$m, the GaAs layer in substantially completely relaxed. As a result, the stress in the GaAs layer is more or less completely eliminated. When the heteroepitaxial structure thus formed is cooled to room temperature, a stress-thickness relationship represented by the continuous line in FIG. 9 appears.

In the diagram of FIG. 9, therefore, it will be understood that one can minimize the warp of the heteroepitaxial substrate at room temperature by setting the thickness of the GaAs buffer layer to be less than 1 $\mu$m to enhance the stress that is applied upon the silicon substrate by another compound, semiconductor layer such as the strained superlattice structure or the InGaAs layer 33 of FIG. 3. Thus, the relationship in FIG. 8 is obviously related to the relationship in FIG. 9. Further, it will be noted that the relationship in FIG. 8 is not limited to the system that employs the strained superlattice structure but is also valid for other structures described with reference to the first and second embodiments.

FIGS. 10(A)–10(D) show various modifications of the heteroepitaxial substrate according to a third embodiment of the present invention.

Referring to FIG. 10(A) showing a first modification of the present embodiment, a GaAs buffer layer 62 is provided on a silicon substrate 61 with a thickness preferably smaller than 1 $\mu$m, and a strained superlattice structure 63 is provided on the GaAs buffer layer 62 with a thickness of 1 $\mu$m, wherein the superlattice structure 63 is formed of an alternate repetition of an undoped InAlGaAs layer and an undoped AlGaAs layer, each having a thickness of 5 nm. The InGaAs layer forming the superlattice structure 63 may contain more than 10%, typically 15%, of the InAs component similarly to the example described earlier with reference to FIG. 8, wherein the superlattice structure 63 has a large resistivity associated with the large band gap pertinent to the AlAs component and acts as an insulating buffer layer in the heteroepitaxial substrate. Further, an undoped InGaAs layer 64 is provided on the strained superlattice structure 63 as an active layer of A HEMT, and an electron supplying layer 65 of p-type InAlGaAs is deposited on the layer 64. Thereby, the total thickness of the layers 63–65 is set at least to 1 $\mu$m so as to exceed the critical thickness for the dislocation formation, similarly to the previous embodiments.

FIG. 10(B) shows a second modification, wherein a strained superlattice structure is used not only for the buffer layer 63 but also for the active layer in the structure of FIG. 10(A) as a layer 64a. In this case, the strained superlattice structure 64a includes an alternate repetition of an undoped InGaAs layer having a composition of $In_{0.15}Ga_{0.85}As$ and a GaAs layer each having a thickness of 5 nm, and the total thickness of the layers 63, 64a and 65 is set at least to 1 $\mu$m, again exceeding the critical thickness for the dislocation formation.

FIG. 10(C) shows a third modification, wherein a strained superlattice structure is used not only for the buffer layer 63 and the active layer 64a but also for the electron supplying layer designated as a layer 65a. The strained superlattice structure 65a has a thickness of about 100 nm and includes an alternate repetition of an n-type InGaAlAs layer having a composition of $In_{0.15}(Al_{0.25}Ga_{0.75})_{0.85}As$ and an n-type AlGaAs layer both doped by silicon. Each layer of the InAlGaAs and AlGaAs has a thickness of 5 nm.

FIG. 10(D) shows a fourth modifications wherein the structures of FIGS. 10(A)–10(C) are combined. Referring to FIG. 10(D), it will be noted that the electron supplying layer includes the two stacked layers 65a and 65. The active layer is selected from one of the bulk epitaxial layer 64 and the strained superlattice structure 64a.

In any of the foregoing modifications, it is possible to intercept the dislocations originating at the interface between the silicon substrate 61 and the GaAs butter layer 62 such that the dislocations are deflected to propagate along the interface of the epitaxial layer elements forming the strained superlattice structure as indicated in FIG. 1. Thereby, the dislocation density in the active layer 64 or 64a can be reduced.

Figure 11:
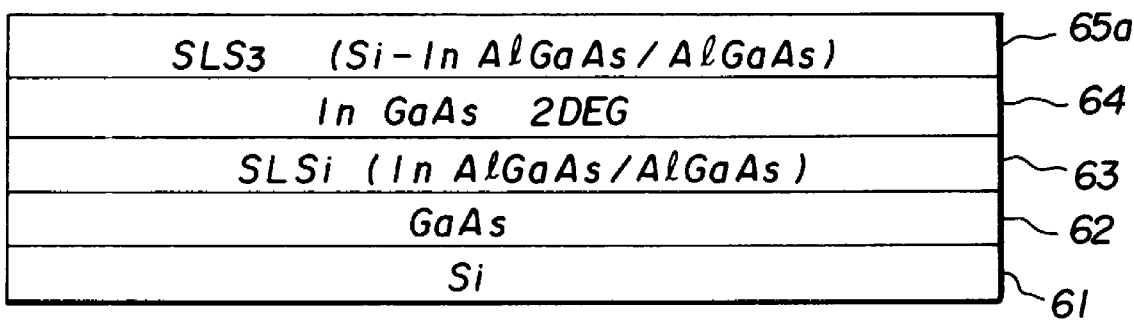
FIG. 11 is a diagram showing a modification of the heteroepitaxial substrate of the third embodiment.

In the modification of FIG. 10(C) or FIG. 10(D), it was further found that the order of deposition is which one of the layer elements forming the strained superlattice electron supplying layer 65a is deposited first, has a substantial effect upon the electronic property of the two dimensional electron gas formed in the active layer. FIG. 11 shows the structure employed for this investigation, wherein the composition of the InAlGaAs layer element forming the strained superlattice structure in the layers 63 and 65a is changed with respect to the composition of the InGaAs layer forming the active layer 64.

More specifically, a layer having a composition of $In_y(Al_{0.4}Ga_{0.6})_{1-y}$ is used for the InAlGaAs layer element that forms the strained superlattice layers 63 and 65a together with the AlGaAs layer element which has a composition of $Al_{0.3}Ga_{0.7}As$, in combination with the active layer 64 that has a composition of $In_zGa_{1-z}As$, wherein the combination of the parameters y and z is changed variously in the experiment. The electron supplying layer 65a having such a strained superlattice structure is formed by stacking the foregoing InAlGaAs and AlGaAs layer elements each having a thickness of 5 nm ten times and hence has a total thickness of 100 nm. The layer elements forming the electron supplying layer 65a is doped by silicon with a concentration of $1.3 \times 10^{18}$ cm$^{-3}$. On the other hand, the active layer is deposited with a thickness of 15 nm. Further the buffer layer 63 has a structure identical with the electron supplying layer 65a except that the layer elements forming the layer 63 is not doped. The following TABLE I shows the result of the experiments, wherein $n_s$ represents the carrier density in the two dimensional electron gas formed in the active layer 64 while $\mu$ represents the carrier mobility of the two dimensional electron gas at a temperature of 77K.

TABLE I

| y | z | $n_s (\times 10^{12} cm^{-2})$ | $\mu (cm^1/VS)$ @ 77K |
|---|---|---|---|
| 0.15 | 0.15 | 1.37 | 31000 |
| 0.10 | 0.10 | 1.19 | 30200 |

TABLE I-continued

| y | z | $n_s(\times 10^{12} cm^{-2})$ | $\mu(cm^1/VS)$ @ 77K |
|---|---|---|---|
| 0.10 | 0.15 | 1.60 | 19100* |
| 0.10 | 0.15 | 1.60 | 25000** |

*InAlGaAs first
**AlGaAs first

The foregoing difference for the cases wherein the parameter z indicative of the In content in the InGaAs active layer 64 exceeds the parameter y indicative of the In content in the electron supplying layer is believed to be caused as a result of the reduced penetration of the electron wavefunction of the two dimensional electron gas into the electron supplying layer 65a, which in turn results in A decreased probability of electron scattering.

Further, a measurement of the warp is made with respect to the heteroepitaxial structure of FIG. 10(A), wherein a silicon substrate having a diameter of 3 inches and a thickness of 600 μm was used for the substrate 61. On the substrate 61, the GaAs buffer layer 62 was deposited with a thickness of 0.5 μm, and the strained superlattice buffer layer 63 was grown on the layer 62 with a thickness of 1 μm by depositing the InAlGaAs layer element having a composition of $In_{0.15}(Al_{0.25}Ga_{0.75})_{0.85}As$ and the AlGaAs layer having the composition of $Al_{0.15}Ga_{0.75}As$ alternately with respective thicknesses of 5 nm. Further, the InGaAs actives layer 64 having a composition of $In_{0.05}Ga_{0.5}As$ was deposited on the layer 63 with a thickness of 0.4 μm, and a gap layer (not shown in FIG. 10(A)) of undoped AlGaAs having a composition of $Al_{0.25}Ga_{0.75}As$ was deposited with a thickness of 10 Å. Further, the electron supplying layer of n-type InAlGaAs was deposited on the foregoing gap layer with a thickness of 50 nm. In the foregoing structure, it was found that the substrate shows a warp having a convex bottom surface, wherein the magnitude of the warp was only 5.5 μm. This falls well in the range of the acceptable warp prescribed for the bulk GaAs substrate, which is 7 μm.

It should be noted further from the foregoing TABLE I, that the heteroepitaxial substrate according to the present invention can provide a satisfactory electron mobility for the two dimensional electron gas while using a very small total thickness of the epitaxial layers of less than 1.5 μm.

It should be noted that the foregoing heteroepitaxial substrate disclosed with reference to the first through third embodiments are by no means limited to the HEMT but Is applicable also to other compound semiconductor devices such as MESFET.

Further, the present invention is not limited to the embodiments described heretofore, but various variations and modifications may be made without departing from the scope of the invention.

In one embodiment of the compound semiconductor device of the invention which comprises a strained superlattice structure between the first compound semiconductor layer and the second compound semiconductor layer as described above, the first layer element of this first strained superlattice structure may comprise InAlGaAs wherein the InAs content exceeds 10% in mole fraction, the second layer element of this first strained superlattice structure comprises AlGaAs, and this first strained superlattice structure has a thickness of 0.5 μm or more. The compound semiconductor material in the second compound semiconductor layer of this embodiment may be InGaAs containing In in a mole fraction of 5% or less, and the thickness of this second compound semiconductor layer may exceed the critical thickness. This embodiment may also further comprise an active layer of a compound semiconductor device in which the active semiconductor device is formed, and the total thickness of the first and second compound semiconductor layers and the first strained superlattice structure provided above the silicon substrate falls in a range from 1.0 μm to 2.0 μm. The second compound semiconductor layer may further include a second strained superlattice structure of an alternate repetition of a layer element of InGaAs and a layer element of GaAs. This second strained superlattice structure may be provided between the silicon substrate and the first strained superlattice structure.

What is claimed is:

1. A compound semiconductor device constructed on a heteroepitaxial substrate, comprising:

a silicon substrate having upper and lower major surfaces;

a first compound semiconductor layer of a first compound semiconductor material having upper and lower major surfaces separated from each other by a first thickness, said first compound semiconductor layer being provided on said silicon substrate, said first compound semiconductor material having a first lattice constant;

a second compound semiconductor layer of second and third compound semiconductor materials having upper and lower major surfaces separated from each other by a second thickness, said second compound semiconductor layer being provided on said first compound semiconductor layer, at least one of said second and third compound semiconductor materials having a second lattice constant substantially larger than said first lattice constant, said second thickness being set substantially larger than a critical thickness above which dislocations develop in said second compound semiconductor layer; and an active layer of an active semiconductor device constructed in said second compound semiconductor layer;

wherein said dislocations are created at said upper major surface of said silicon substrate and are substantially confined in the vicinity of an interface between said first compound semiconductor layer and said second compound semiconductor layer.

2. A compound semiconductor device as claimed in claim 1, wherein said first compound semiconductor material consists of GaAs, and one of said second and third compound semiconductor materials comprises a compound semiconductor material selected from a group consisted of InGaAs and InAlGaAs.

3. A compound semiconductor device constructed on a heteroepitaxial substrate, comprising:

a silicon substrate having upper and lower major surfaces;

a first compound semiconductor layer of GaAs having upper and lower major surfaces separated from each other by a first thickness, said first compound semiconductor layer being provided on said silicon substrate;

a second compound semiconductor layer having upper and lower major surfaces separated from each other by a second thickness and provided on said first compound semiconductor layer; and an active layer of an active semiconductor device formed in said second compound semiconductor layer;

wherein said second compound semiconductor layer comprises a stacking of a layer of InGaAs and a layer of InAlGaAs;

wherein said second thickness is set substantially larger than a critical thickness above which dislocations develop in said layer of InGaAs and said layer of InAlGaAs forming said second compound semiconductor layer; and wherein said dislocations are created at said upper major surface of said silicon substrate and are substantially confined in the vicinity of an interface between said first compound semiconductor layer and said second compound semiconductor layer.

4. A compound semiconductor device constructed on a heteroepitaxial substrate, comprising:

a silicon substrate having upper and lower major surfaces;

a first compound semiconductor layer of GaAs having upper and lower major surfaces separated from each other by a first thickness, said first compound semiconductor layer being provided on said silicon substrate;

a second compound semiconductor layer having upper and lower major surfaces separated from each other by a second thickness and provided on said first compound semiconductor layer; and an active layer of an active semiconductor device formed in said second compound semiconductor layer;

wherein said second compound semiconductor layer includes at least first and second layers, said second layer being provided on said first layer, and wherein said first layer has a mirror flat upper major surface on which said second layer is deposited;

wherein each of said first and second layers forming said second compound semiconductor layer has a lattice constant substantially exceeding a lattice constant of said first compound semiconductor layer;

wherein said active layer is formed in said second layer of said second compound semiconductor layer;

wherein said second thickness is set substantially larger than a critical thickness above which dislocations develop in said first and second layers forming said second compound semiconductor layer; and wherein said dislocations are created at said upper major surface of said silicon substrate and are substantially confined in the vicinity of an interface between said first compound semiconductor layer and said second compound semiconductor layer.

5. A compound semiconductor device constructed on a heteroepitaxial substrate comprising:

a silicon substrate having upper and lower major surfaces;

a first compound semiconductor layer of GaAs having upper and lower major surfaces separated from each other by a first thickness, said first compound semiconductor layer being provided on said silicon substrate;

a second compound semiconductor layer having upper and lower major surfaces separated from each other by a second thickness exceeding a critical thickness above which dislocations develop in said second compound semiconductor layer, said second compound semiconductor layer being provided on said first compound semiconductor layer; and an active layer of an active semiconductor device formed in said second compound semiconductor layer;

wherein said second compound semiconductor layer in includes a first strained superlattice structure, said first strained superlattice structure comprising in alternate repetition of a first layer that contains In and a second layer free from In, said first layer having a lattice constant substantially exceeding a lattice constant of said second layer and further a lattice constant of said first compound semiconductor layer; and wherein said dislocations are created at said upper major surface of said silicon substrate and are substantially confined in the vicinity of an interface between said first compound semiconductor layer and said second compound semiconductor layer.

6. A compound semiconductor device as claimed in claim 5, wherein a total thickness of said first and second compound semiconductor layers falls in a range from 1.0 $\mu$m to 2.0 $\mu$m.

7. A compound semiconductor device as claimed in claim 5, wherein said second compound semiconductor layer further includes a second strained superlattice structure of an alternate repetition of a layer of InGaAs and a layer of GaAs.

8. A compound semiconductor device constructed on a heteroepitaxial substrate, comprising:

a silicon substrate having upper and lower major surfaces;

a first compound semiconductor layer of GaAs having upper and lower major surfaces separated from each other by a first thickness, said first compound semiconductor layer being provided on said silicon substrate;

a second compound semiconductor layer having upper and lower major surfaces separated from each other by a second thickness and provided on said first compound semiconductor layer; and an active layer of an active semiconductor device formed in said second compound semiconductor layer;

wherein said second compound semiconductor layer comprises: a first strained superlattice layer consisting of an alternate repetition of an InAlGaAs layer element having a composition of $In_y(Al_{Ga})_{1-y}As$ and an AlGaAs layer element; an undoped InGaAs layer having a composition of $In_zGa_{1-z}As$; and a second strained superlattice layer consisting of an alternate repetition of an InAlGaAs layer element having a composition of $In_y(AlGa)_{1-y}As$ and an AlGaAs layer element; wherein the compositional parameter z is set larger than the compositional parameter y;

wherein said second thickness is set substantially larger than a critical thickness above which dislocations develop in said layers forming said second compound semiconductor layer; and wherein said dislocations are created at said upper major surface of said silicon substrate and are substantially confined in the vicinity of an interface between said first compound semiconductor layer and said second compound semiconductor layer.

9. A compound semiconductor device as claimed in claim 8, wherein said second strained superlattice layer has a lower major surface coincident to a lower major surface or the lowermost InAlGaAs layer element that forms said second strained superlattice layer.

10. A high mobility transistor constructed on a heteroepitaxial substrate, comprising:

a silicon substrate having upper and lower major surfaces;

a first compound semiconductor layer of a first compound semiconductor material having upper and lower major surfaces separated from each other by a first thickness, said first compound semiconductor layer being provided on said silicon substrate, said first compound semiconductor layer having a first lattice constant;

a second compound semiconductor layer having upper and lower major surfaces separated from each other by a second thickness and provided on said first compound semiconductor layer, said second compound semiconductor layer being a composite layer comprising:

an insulating layer of an undoped second compound semiconductor material having a first band gap and a second lattice constant substantially larger than said first lattice constant, said insulating layer having upper and lower major surfaces, said lower major surface of said insulating layer being coincident to said lower major surface of said second compound semiconductor layer;

a channel layer of an undoped third compound semiconductor material having a second band gap smaller than said first band gap and a third lattice constant substantially larger than said first lattice constant, said channel layer having upper and lower major surfaces and provided on said insulating layer; and a carrier supplying layer comprising a fourth compound semiconductor material doped to have a conductivity type, said carrier supplying layer having a third band gap substantially larger than said second band gap and a fourth lattice constant substantially larger than said first lattice constant, said carrier supplying layer having upper and lower major surfaces and provided on said channel layer, said upper major surface of said carrier supplying layer being coincident to said upper major surface of said second compound semiconductor layer;

said channel layer including a two dimensional carrier gas along said upper major surface thereof;

at least said insulating layer in said second compound semiconductor layer having a thickness exceeding a critical thickness of said insulating layer above which dislocations are introduced in said insulating layer;

gate electrode means provided on said upper major surface of said carrier supplying layer for establishing a Schottky contact therewith;

source electrode means provided on said upper major surface of said carrier supplying layer for injecting carriers therein; and drain electrode means provided on said upper major surface of said carrier supplying layer for collecting carriers therefrom;

wherein said dislocations are created at said upper major surface of said silicon substrate and are substantially confined in the vicinity of an interface between said first compound semiconductor layer and said second compound semiconductor layer.

* * * * *